United States Patent
Zalmanoff

(10) Patent No.: US 7,535,127 B2
(45) Date of Patent: May 19, 2009

(54) SOLID STATE RELAY DRIVER

(75) Inventor: Alexander Zalmanoff, Louisville, KY (US)

(73) Assignee: Industrial Control Solutions, Inc., Louisville, KY (US)

( * ) Notice: Subject to any disclaimer, the term of this patent is extended or adjusted under 35 U.S.C. 154(b) by 348 days.

(21) Appl. No.: 11/493,188

(22) Filed: Jul. 26, 2006

(65) Prior Publication Data

US 2007/0024124 A1 Feb. 1, 2007

Related U.S. Application Data

(60) Provisional application No. 60/703,273, filed on Jul. 28, 2005.

(51) Int. Cl.
*H01H 33/52* (2006.01)
*H03K 17/00* (2006.01)
*H03K 17/04* (2006.01)

(52) U.S. Cl. ............... 307/115; 327/365; 327/376; 327/377

(58) Field of Classification Search ........... 307/112, 307/115; 327/496, 376, 377, 365
See application file for complete search history.

(56) References Cited

U.S. PATENT DOCUMENTS

| | | | | |
|---|---|---|---|---|
| 5,301,085 | A | * | 4/1994 | Miettinen ............ 361/93.6 |
| 5,864,475 | A | * | 1/1999 | Ikawa et al. ............ 363/57 |
| 6,163,200 | A | * | 12/2000 | Iijima ............ 327/438 |
| 2002/0175719 | A1 | * | 11/2002 | Cohen ............ 327/108 |

* cited by examiner

*Primary Examiner*—Albert W Paladini
*Assistant Examiner*—Michael Rutland Wallis
(74) *Attorney, Agent, or Firm*—Michael Ries

(57) ABSTRACT

The present invention is a solid state relay having improved high speed turn on and lower heat dissipation of the power transistor. It uses a voltage level converter and AC-DC converter to provide a control input to an isolation transformer primary. The secondary of the isolation transformer is rectified and charges capacitors having capacitance much higher than that of control input of the power transistor. Transistors are coupled to a controller and the capacitors. The transistors are controlled by the controller to provide for the charging of the capacitors and later transferring of voltage from the capacitors into the capacitance of the control input of the power transistor so that it is charged quickly and turns on quickly. Similar operation occurs for quickly turning off the power transistor.

4 Claims, 4 Drawing Sheets

SOLID STATE RELAY DRIVER

This application claims the benefit of U.S. Provisional Patent Application Ser. No. 60/703,273, filed Jul. 28, 2005.

TECHNICAL FIELD & BACKGROUND

The present invention generally relates to the field of solid state relays. More specifically, the present invention relates to improving the switching characteristics of solid state relays whose output section is built on MOSFETs. Improving these characteristics will allow us to decrease dynamic loses on solid state relays so an output stage having a number of MOSFETs in parallel can be built.

Solid Solid State Relays (AKA SSRs) with the output stage built on power MOSFETs are well known devices on today's electronics market because they are easily controllable and can be used in applications to conduct AC or DC currents, or both. The MOSFETs switches manufactured today are designed to have very little drain-source resistance in the conductive "ON" state, allowing the conduction of very high currents with minimal power losses on the device.

There are two main types of power losses on MOSFETs static and dynamic.

Static losses are the result of the electrical resistance of the MOSFET's drain-source channel in the conductive state and power losses on the SSR's output stage built on MOSFETs will be determined as the function of this resistance and operational current flowing through the drain-source. These losses will limit the SSR's maximum operational current and its maximum operational temperature without using any heat sinks. For example, the IRFB4410 MOSFET manufactured by International Rectifier™ has 10 milliohm drain-source resistance in the conductive state. Power losses on this particular device will be equal to 1 watt when 10 A of current flows through the drain-source channel. According to the International Rectifier™ technical specifications, dissipating 1 watt on the IRFB4410 MOSFET having TO-220 package without using a heat sink will increase the MOSFET's junction temperature up to 80-85° C. in a condition when the ambient temperature is 25° C. It will be increased up to 140-145° C. in a condition when the ambient temperature is 85° C., which is the standard maximum industrial ambient temperature level.

Dynamic losses on the MOSFET will occur during the time when the device is switched to the "ON" from the "OFF" state and vise versa. Thus the slower switching time will cause larger dynamic losses as well as bigger losses of power dissipation on the MOSFET. Taking in consideration the MOSFET's gate-source capacitance value there are certain difficulties in achieving the fast charging and discharging time of this built into the MOSFET. Fast switching time is especially difficult to achieve when the input control signal source is used to switch the MOSFET into a conductive or nonconductive state has the limited output power.

Static losses on the SSR's power output stage built on the MOSFET could be decreased by connecting the same type of MOSFETs in parallel. For example, to decrease the static losses by two times it would require the doubling of the same type of MOSFETs connected in parallel, thus, the MOSFET' gate-source capacitance will be increased proportionally and will be equal to the sum of the gate-source capacitance of each MOSFET connected in parallel. Knowing that the gate-source capacitance of the power MOSFET is approximately equal to 3-10 nF, the resulting common gate-source capacitance of the two or more MOSFETs connected in parallel could reach tens of nanoFarads. As a result of this, dynamic losses on the device will be increased correspondingly.

There are number of ways to control the SSR's output stage built on power MOSFETs, but what all of them have in common is that generated voltage needs to be applied to the MOSFET's gate-source to reliably switch it. The only difference is what kind of device will be used to generate this voltage and how the primary control circuitry is isolated from the secondary one, which in turn will control the SSR's power MOSFET's output stage.

This control voltage can be applied to the MOSFET' GATE-SOURCE by using a photovoltaic device or DC/DC converter built using a transformer.

Because of their lack on generated output energy, a photovoltaic device can only be used to control the low current MOSFETs having low GATE-SOURCE capacitance value. In this case the output switching time will be in range from ones to hundreds of milliseconds.

Using a DC\DC converter built on an isolation transformer to generate voltage to control the MOSFET is more preferable because these converters are able to deliver much higher energy to charge the MOSFET's GATE-SOURCE capacitance than a photovoltaic device. This is the reason why this method of MOSFET control will allow the building of more powerful SSRs.

One of the examples of using DC\DC converters can be found in U.S. Pat. No. 4,438,356 by Kenneth Fisher, Assignee International Rectifier Corp. In this case the MOSFET control is achieved by the transformation of energy from the primary control circuitry to the secondary by using a DC/DC converter. This DC/DC converter builds up the energy directly on the GATE-SOURCE capacitance of the MOSFET with every cycle by charging it. It will take a certain amount of cycles to build up enough energy directly on the MOSFET's input GATE-SOURCE capacitance charging it to switch the MOSFET from the "OFF" to the "ON" state and in this case, the switching time span can reach tens of microseconds. The discharging circuitry is built on JFET and the JFET's channel resistance is usually tens of ohms in a best case scenario, thus the required time to switch the power MOSFET can reach hundreds of microseconds.

In a situation when the output stage is built by connecting a plurality of MOSFETs in parallel, this time will be increased significantly, therefore escalating the dynamic losses and decreasing the reliability of the SSR itself.

The purpose of this patent is to improve the switching characteristics of the SSR's MOSFET output control circuitry. Improving these characteristics will allow the decreasing of the dynamic losses, thus allowing the connecting of a number of MOSFETs in parallel to build more powerful and reliable SSRs Our goal is to achieve the fastest possible MOSFET's switching time to the ON and the OFF state. This can be achieved only by very fast charging and discharging of MOSFET's gate-source capacitance.

The main idea as how to significantly improve this charging and discharging time is to charge some additional external capacitors with a much bigger capacitance value than the MOSFET's gate-source own capacitance to the voltage level high enough to control the MOSFET' state. Energy received from the isolation transformer is used to charge this additional capacitor circuitry.

After the voltage level on the external capacitors reach a level high enough to change the MOSFET's state, it will be applied by fast electronic switches to the MOSFET's gate-source. Voltage from these capacitors will charge the MOSFET's input capacitance thus changing its state from OFF to ON. In other words, we can treat these external capacitors as some sort of accumulator from which the energy is transferred by fast electronic switches to the MOSFET's gate-source and thus switching the MOSFET to the ON state.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention, however, the order of description should not be construed as to imply that these operations are necessarily order dependent. In particular, these operations need not be performed in the order of presentation.

Figure 1:
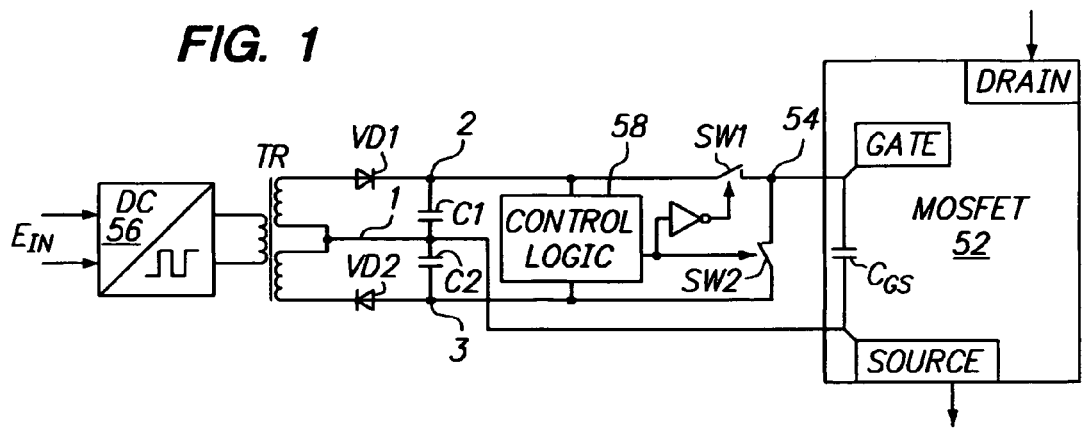
FIG. 1 illustrates a structural block diagram of the SSR using MOSFET in accordance with an embodiment of the present invention.
Figure 2:
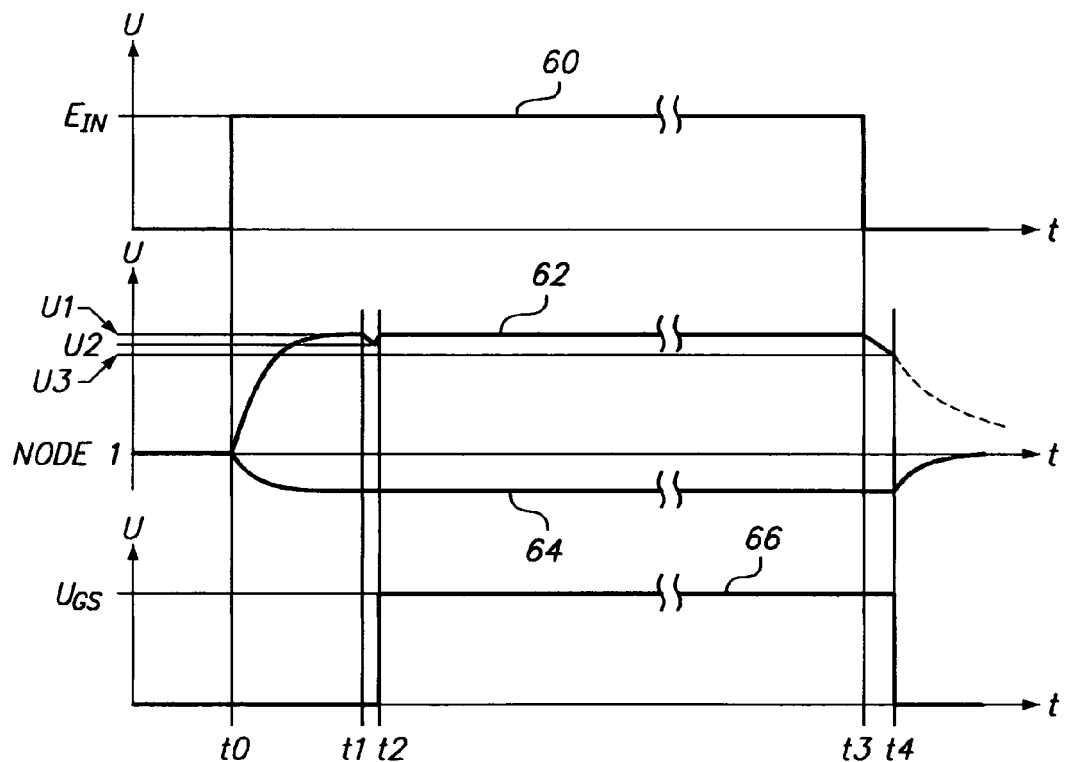
FIG. 2 illustrates a timing diagram related to the SSR driver circuit in accordance with an embodiment of the present invention.

FIG. 1 shows a general block diagram and FIG. 2 shows waveforms from various nodes in FIG. 1 to explain how the SSR operates.

FIG. 1 represents the structural block diagram of the SSR built using MOSFET 52 or connected in parallel plural MOSFET 52 devices. In this drawing the MOSFET 52 or connected in parallel MOSFET 52 devices is represented by its capacitance equivalent $C_{GS}$ one pole of which is called the gate which is connected to the switches SW1 and SW2 at node 54 and another pole which is called the source which is connected to capacitors C1 and C2 at node 1.

Next turning the MOSFET 520N is explained. Under the initial condition, capacitors C1 and C2 are discharged, switch SW1 is open or turned OFF and switch SW2 is closed or turned ON. The capacitance $C_{GS}$ is discharged and the MOSFET 52 is in the OFF state. Charging the $C_{GS}$ to the voltage level to switch MOSFET 52 to the ON state will consist of three phases listed below.

In phase 1, at FIG. 1, and FIG. 2 waveform 60, the control input voltage $E_{IN}$ is applied to the converter 56 from an external voltage source. Converter 56 will then start transferring input energy or voltage to the secondary circuitry of isolation transformer TR by generating voltages of certain level. The voltages from secondary are used as power supply voltage for the control logic circuit 58. This voltage is applied to the capacitors C1 and C2 and charges them accordingly. C1 will start charging positively on node 2 with respect to the common node 1 as represented by waveform 62 in FIG. 2 and capacitor C2 will start charging negatively on node 3 with respect to the common node 1 as represented by waveform 64 in FIG. 2. The above initial stage in waveforms 62 and 64 starts at time t0 in FIG. 2.

In Phase 2, during the timing interval from t0 to t1 in FIG. 2, capacitor C1 will start charging positive as shown in waveform 62 in FIG. 2 to a voltage level U1 which is high enough to turn the MOSFET 52(s) to the ON state while SW1 is OFF. At the same time capacitor C2 at node 3 will discharge to the level of approximately negative 3-5 volts as shown in waveform 64 of FIG. 2. Accordingly, negative current flow through the normally closed switch SW2 from node 3 will discharge the gate of the MOSFET 52(s) with respect to its source, thus holding the MOSFET 52(s) in the OFF state.

In phase 3, when the voltage on capacitor C1 reaches voltage level U1 as shown in waveform 62 of FIG. 2, the control logic 58 will turn the switch SW2 to the OFF state and turn the switch SW1 to the ON state. Capacitance $C_{GS}$ will be recharged by the positive potential from capacitor C1 at node 2 through the closed switch SW1 to U1 as shown at time t2 on waveform 62 in FIG. 2 thus turning the MOSFET 52 to ON state at t2 as shown in waveform 66 at voltage $U_{GS}$.

From the explanation above, the time to switch the MOSFET 52(s) into the ON state depends on how fast the switch SW1 will be turned to the ON state and the equivalent conductivity of switch SW1. The minimum proportional value of the capacitor C1 respect to the $C_{GS}$ capacitance should be chosen with following considerations. This value will determine the value of the voltage drop from U1 to U2 during the time interval t1-t2 in waveform 62 of FIG. 2. Minimum capacitance value of the capacitor C1 should be sufficient enough to hold the voltage U2 on a level that reliably keeps the MOSFET 52(s) in the ON state during the recharging of the $C_{GS}$ by accumulated charge on capacitor C1. Capacitance value of capacitor C1 should be chosen approximately 10 times larger than the total capacitance value of $C_{GS}$ of the MOSFET 52(s) in a condition when voltage U1 on the capacitor C1 at the time t1 shown in waveform 62 of FIG. 2 would be within the MOSFET 52 control voltage $U_{GS}$ or threshold voltage range which is about 10-15V as shown in waveform 66. At the same time, the voltage on C1 should not go any higher than about 20-30V, which is the maximum allowed voltage $U_{GS}$ to be applied to the gate and source of the MOSFET 52(s) device.

Next turning the MOSFET 52 OFF is explained. |Discharging the capacitor $C_{GS}$ which means turning the MOSFET 52 to the OFF state can be described in the following two phases listed below.|

In Phase 1, the control voltage $E_{IN}$ drops to zero volts or is removed from the input control circuitry of the converter 56. The energy transfer or voltage from the primary circuitry to the secondary circuitry through isolation transformer TR will stop and the capacitors C1 and C2 will start discharging through the control circuitry of the control logic 58. This occurs at time t3 as shown in waveform 60 and 62 of FIG. 2.

In phase 2, when the voltage on C1 drops to the voltage level U3 at time t4 as shown in waveform 62 of FIG. 2, the internal comparators in the control logic 58 will change their state thus returning the switch SW1 to the OFF state and SW2 to the ON state. The gate side of the MOSFETs gate-source input capacitance equivalent $C_{GS}$ will be connected by the switch SW2 to the capacitor C2, which |applies negative voltage with respect to the source side of the MOSFET 52, discharging the $C_{GS}$ and thus turning the MOSFET 52 to the OFF state. This discharging of MOSFET 52(s) $C_{GS}$ is shown at time interval t3-t4 as shown in waveform 62 and 64 of FIG. 2. The $C_{GS}$ discharging time will mainly depend on the equivalent conductivity of switch SW2. Using MOSFETs with very small channel resistance ON state for switch SW2; will allow recharging of the capacitance $C_{GS}$ of the MOSFET 52 approximately within 100-200 nS.

Figure 3:
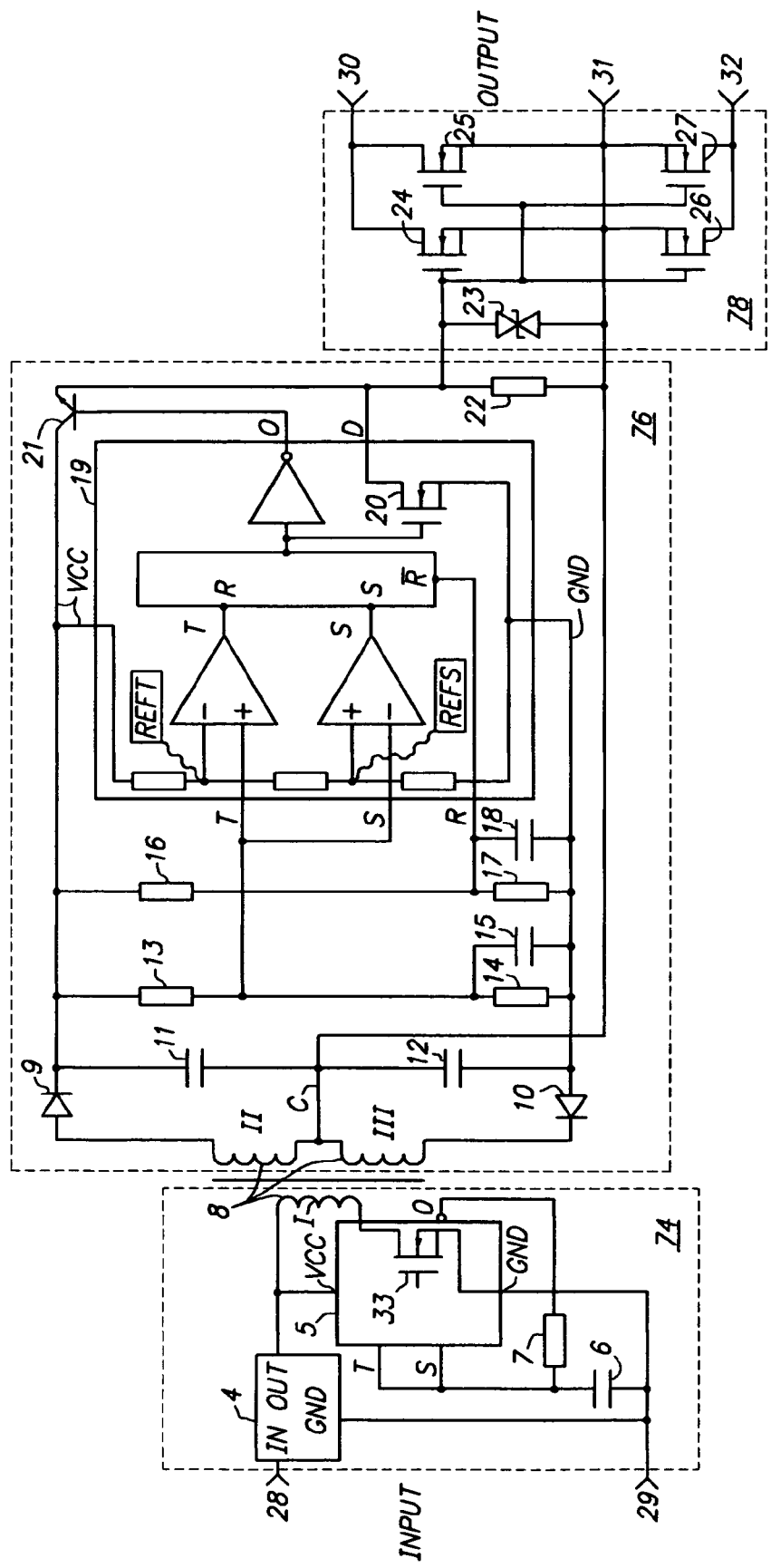
FIG. 3 illustrates a detailed schematic drawing of the Solid State Relay in accordance with one embodiment of the present invention.
Figure 4:
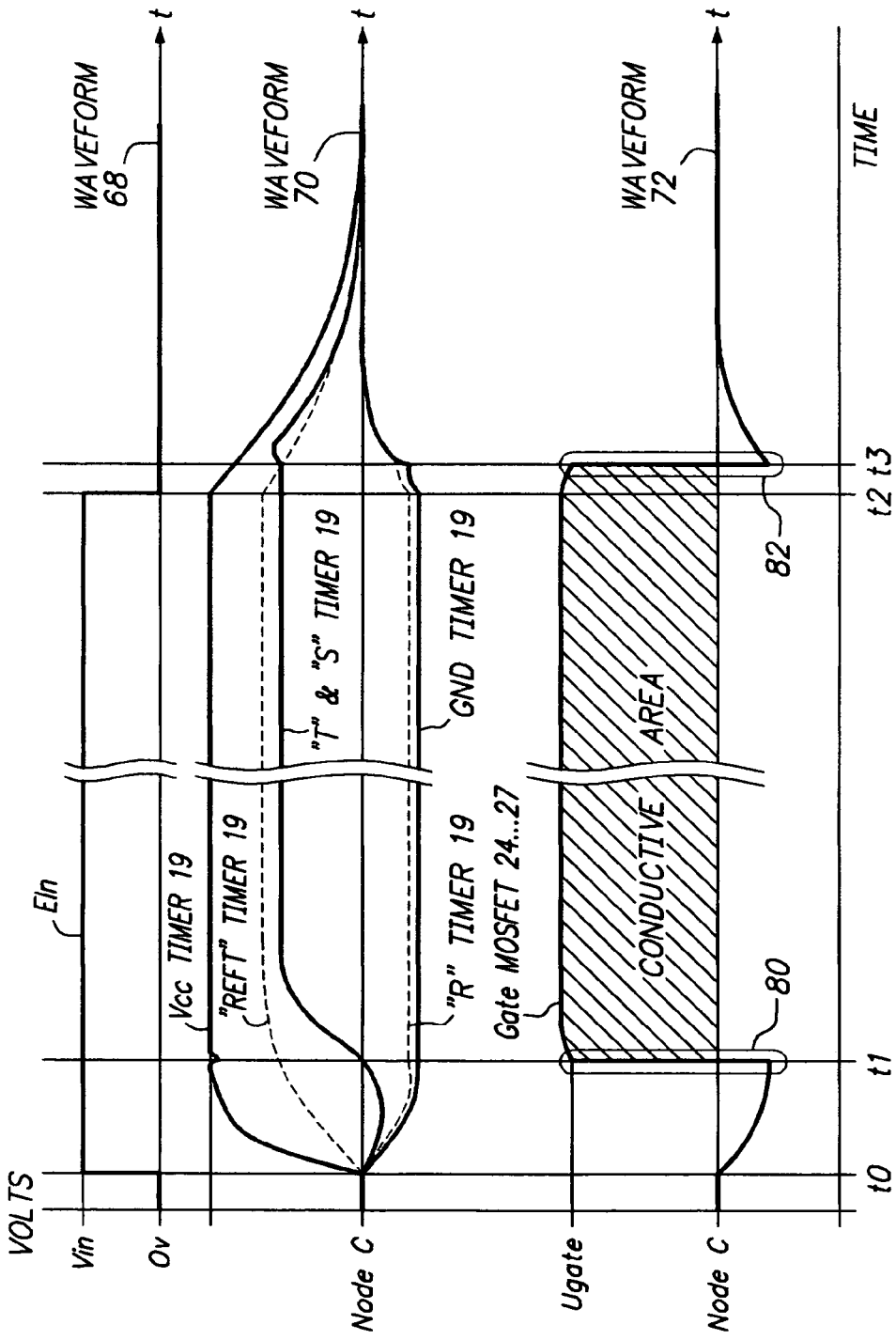
FIG. 4 illustrates waveforms related to FIG. 3 for explaining the operation of the Solid State Relay in accordance with one embodiment of the present invention.
Figure 5:
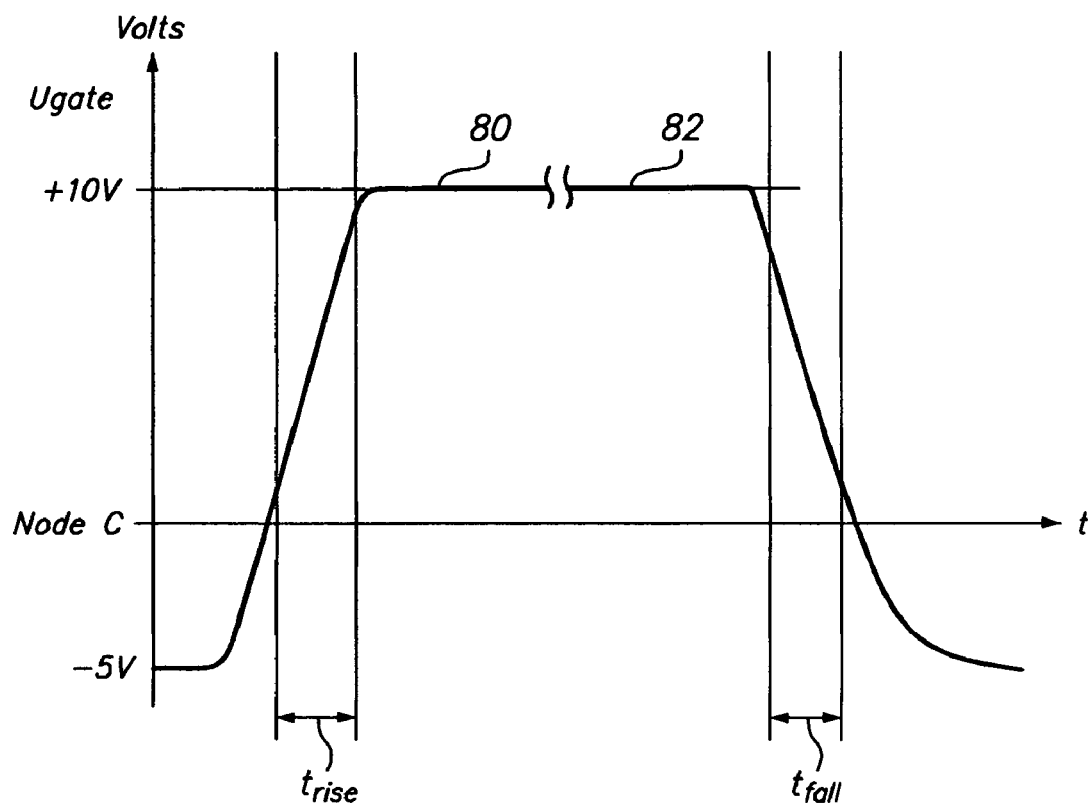
FIG. 5 illustrates an exploded waveform of in FIG. 4 in accordance with one embodiment of the present invention.

Detailed description of the control techniques for the output section of the Solid State Relay (SSR) created by using the MOSFETs is based on the schematic in FIG. 3 and waveform diagrams presented by FIG. 4 and FIG. 5.

According to the FIG. 3, the SSR consists of four main sections: an input section 74; an isolation section having transformer 8; a logic control section 76; an output section 78 having a plurality of parallel connected power MOSFET's 24-27 allowing for AC or DC applications.

The main components of the input |control section 74 are the voltage stabilizer 4 and the AC generator 5. The function of this section is to transform the energy of the applied input control voltage $E_{IN}$ at terminals 28 and 29 to the pulses which are applied to the primary of the isolation transformer 8 and in turn will produce pulses on the secondary of the transformer 8. See waveform 68 in FIG. 4. Another very important function of the input section 74 is to stabilize the output voltage from the secondary of transformer to a voltage level safe enough to reliably control the SSR when applied to the gates of the MOSFET 24-27.

The input control section 74 consists of a voltage stabilizer 4 built on the LM317 voltage regulator chip. The use of an LM317 allows a 4.7-32V span of the input control voltage $E_{IN}$ for the SSR and the output of 3.3V stabilized voltage from LM317. The 3.3V volts is applied to the AC generator 5 which uses the popular CMOS version of the 555 series timer. The pulses from the 555 timer have a frequency of 250-300 kHz, which is determined by the value of capacitor 6 and resistor 7 timing feedback network circuitry. The connections of T, S, O of the 555 timer 5 and capacitor 6 and resistor 7 configure the 555 timer as an astable multivibrator. The output of AC generator 5 is then applied to the primary of the isolation transformer 8.

The isolation transformer 8 serves two purposes: the first purpose is to transfer energy or voltage collected via transformer 8 during the forward current flow in the primary winding I when the transistor 33 of the AC generator is in the ON state, to the secondary windings II and III. |Later, current flow is reversed in the primary winding I when the transistor 33 is turned to the OFF state and the reverse current is transferred to the secondary windings II and III. The second purpose of the transformer is to isolate the SSR's control circuitry from the output section which is built on power MOSFET's and the load circuitry.

Therefore, secondary coils II and III of transformer 8 are generating positive and negative pulses with respect to the common node C in FIG. 3. See waveform 70 Vcc and GND of timer 19 in FIG. 4. The sources of MOSFETs 24-27 are connected to the same common node C in FIG. 3. The positive voltage amplitude will reach approximately 12V and negative amplitude value will be approximately within the 3-5V range. Voltages are stabilized by the input section 74 as described above.

The logic control section 76 in FIG. 3 is responsible for generating all timing and control signals necessary to control the SSR's output section built on the MOSFET 24-MOSFET 27. The logic control section 76 is also responsible for watching the amplitude level from the secondary coils II and III of transformer 8, in case there is a situation when the input voltage $E_{IN}$ falls below the minimum level to assure that the MOSFETs 24-27 will operate at a safe working range. The logic control section 76 consists of a common CMOS 555 timer 19 with the internal discharging transistor switch 20, the charging transistor switch 21, voltage accumulating capacitors 11 and 12, timing and amplitude control network built on resistors 13, 14, 16, 17 and capacitors 15 and 18. A half period rectifier circuitry is built by the network connection of the secondary coils II and III of transformer 8, diodes 9 and 10 and energy accumulating capacitors 11, and 12. The voltage from transformer 8 is rectified by diodes 9 and 10 and the voltage will charge the capacitors 11 and 12. Capacitors 11 and 12 were respectively represented by capacitors C1 and C2 on the functional block diagram FIG. 1. Resistor 22 will serve a double function: as the emitter load of the transistor 21 and at the same time blocking the input gate-source capacitance of MOSFETs 24-MOSFET 27, thus preventing the MOSFETs from randomly switching from the OFF to the ON state, because of the voltage ripples on the SSR outputs 30, 31, 32. This is the well known dV/dT effect.

The output section 78 consists of power MOSFET 24-MOSFET 27. Depending on the number of MOSFETs and their connection, the SSR will have the following different output parameters: maximum output current and voltage on the load, the type of SSR, and its ability to conduct only DC or AC/DC current. For example, if we built an SSR using only MOSFET 24 and MOSFET 25 as shown, this SSR will conduct DC current only. If we add MOSFET 26 and MOSFET 27 to MOSFET 24 and MOSFET 25, the SSR will became "universal", and will conduct DC or AC current. When we say "AC current" it means that the SSR is able to conduct loads having not just sinusoid current, but any form of signals including square waves or the sum of DC+AC signals. When a universal SSR conducts square wave output current or another type of currents with sharp rising fronts, the designer has to take in consideration the value of power MOSFETs internal capacitance. The zener diode 23 will protect the gate of MOSFET 24-MOSFET 27 by stabilizing the voltage level on the gate within 15-18V, keeping it within safe working range in both polarities.

Initially when there is no input voltage $E_{IN}$ applied to the pins 28, 29 of FIG. 3 of the input section 74, $E_{IN}$ is zero volts the output of timer 19 isn't energized, the capacitors 11, 12, 15, 18 are discharged, and MOSFET 24-MOSFET 27 are in the OFF state. The Solid State Relay (SSR) will become energized after the input voltage $E_{IN}$ in the range of 4,7V-32V is applied to the pins 28 (+) and 29 (−). This input voltage $E_{IN}$ is applied to the voltage stabilizer 4 and from its output is stabilized to 3.3V and is applied to the AC generator 5 as a power supply voltage. AC generator 5, after receiving power supply voltage, will start generating pulses with a duty cycle of 2 and a period equaling 4 microseconds. Within 2 microseconds of the first half of a period, output switch 33 of the AC generator 5 will be in the ON state and during the second half of the period in the OFF state.

When the output transistor 33 is in the ON state it will conduct current through the primary I of transformer 8. Magnetic energy will start accumulating in the transformer 8 ferrite core. When the transistor 33 is switched to the OFF state this magnetic energy accumulated in the transformer core will be transformed back to electrical energy through the secondary coils II and II. Generated voltage from the secondary coils II and III of the transformer 8 will be applied to the diodes 9 and 10 turning them ON.

The current rectified by diodes 9 and 10 will charge capacitor 11 positively with respect to the common node C. Capacitor 12 will be discharged with negative voltage with respect to the same node C. This voltage also serves as a power supply for the timer 19. The voltage on capacitors 11 and 12 will start building up and will increase its level with every cycle of pulses from AC generator 5. See the time period t0 to t1 of waveform 70 in FIG. 4 at GND and $V_{cc}$. The power supply voltage for the timer 19 is increasing and capacitors 11, 15 and 18 are charging and capacitor 12 is discharging.

The voltage on input R of timer 19 is kept below a threshold level with respect to the GND for certain time period. This time is controlled by the time constant of the timing network of resistors 16, 17 and capacitor 18. See waveform section R timer 19, of waveform 70 in FIG. 4

At the same time the output voltage level from the output O will be low thus keeping transistor 21 in the OFF state and transistor 20 or output D of timer 19 is in the ON state and forms the negative potential on the gate of MOSFETs 24-27. This negative potential from output D or transistor 20 is applied to the gate of MOSFET 24-MOSFET 27. This time period from t0 to t1 of waveform 72 in FIG. 4 shows the negative potential keeping the MOSFETs 24-27 in the OFF state.

Input R of the timer 19 has higher priority than inputs T and S and will override any voltage level changes that might appear on inputs T and S, thus outputs of the timer 19 at O and D will not change their state until voltage level on input R is kept below a 1V threshold level with respect to the GND pin. See waveform sections GND timer 19 and R timer 19 of waveform 70 in FIG. 4.

At a certain time when the voltage potential difference between the input R and GND pin rises above 1 volt as shown at time t1 waveform 70 of FIG. 4 timer 19 will became controllable from the inputs T and S. The time period from t0 to t1 of FIG. 4 is chosen to be sufficient enough to allow capacitors 11 and 12 to charge to their full working potential within 1.5-2.5 milliseconds, and this time is the SSR's switching time delay.

The time constant value of the timing network built on resistors 13, 14 and capacitor 15 chosen to keep voltage level on input S and T of timer 19 below ⅓ of internal comparator's reference voltage REFS| until time t1 in waveform 70 of FIG. 4.

As soon as the voltage on input R rises above 1V with respect to GND of timer 19, input S will become a priority and the voltage potential on input S will trigger timer 19 thus bringing its output O to the high level state and turning transistor 20 to the OFF state. At this time capacitor 11 is fully charged to the full positive power supply voltage of 11V-12V. The same voltage level will be present on output O of timer 19 and accordingly on the base of transistor 21 which is connected to it. The switch transistor 21 is arranged as an emitter follower and thus the transistor 21 will conduct current to the load of this emitter follower, which is resistor 22. Connected to the resistor 22 in parallel is equivalent MOSFET24-MOSFET27 gate-source capacitance. Thus MOSFET24-MOSFET27 will be switched to the ON state and they will start conducting current to the load as shown in waveform 72 in FIG. 4.

As shown in FIG. 3, in a situation for DC output current applications, the load is connected to the pins 30 and 31. The load is connected to the pins 30 and 32 for the AC applications.

The process of turning the SSR to the ON state is complete when the potential on S and T inputs are 0.4V-0.5V below the potential on internal comparator's REFT input of the timer 19 as shown in the REFT and T, S parts of waveform 70 This voltage level is determined by the proportional value of resistors 13 and 14. At this particular time, timer 19 is in a stable condition with a high level voltage potential formed on output O. This high voltage potential Ugate supplied by capacitor 11 keeps the output MOSFETs 24-27 in a conductive ON state through transistor 21. This condition is shown as the conductive area on waveform 72 in FIG. 4 starting at a time after t1 and ending at time t2.

The turn ON and turn OFF transitions 80 and 82 shown in FIG. 4 are shown in greater detail in FIG. 5 with regard to both time and voltage values.

According to the OEM technical specifications (for example National Semiconductor part LMC555) the timer 19 output O triggering time is 15-25 nanoseconds. The MOSFET24-MOSFET27 gate-source capacitance of approximately equivalent of 10-15 nF, will have a charging time to the 10V level of approximately 100-200 nanoseconds $t_{rise}$ as shown in waveform section 80 in FIG. 4 and exploded in FIG. 5.

The process of switching the SSR to the OFF state or in other words turning the MOSFET24-MOSFET 27 to the nonconductive OFF state is described below. It starts when the control voltage $E_{IN}$ is no longer applied to the inputs 28 and 29 as shown at time t2 in waveform 68 FIG. 4. AC generator 5 will stop generating, thus stopping the energy supply to the primary of the transformer 8. As the result of this stoppage no voltages will be produced by windings II and III of transformer 8. Capacitor 11 is starting to discharge and capacitor 12 is starting to charge by current supply flowing through the internal circuitry of the timer 19 at the time interval t2 to t3 of waveform 70 in FIG. 4. The voltage potential on the REFT input of the internal comparator in timer 19 will drop faster than the voltage potential on input T of timer 19 itself because its voltage potential is supplied from the capacitor 15 which continues to be charged or discharges slower. See time t2 and later on the REFT and T parts of waveform 70.

When the voltage potential on the REFT input of the internal comparator in timer 19 drops below the voltage potential on timer's input T as shown at time t3 in waveform 70 of FIG. 4 the internal comparator in timer 19 will trigger thus bringing the output O to the LOW or zero voltage level. As the result of this switch 21 will be turned to OFF state, and switch 20 will be turned to the ON state. The high voltage potential Ugate that was holding the output MOSFETs 24-27 in a conductive ON state drops off at t2 as shown in waveform 72 of FIG. 4. The gates of the MOSFET 24-MOSFET 27 will be connected through the switch 20 to the negatively charged capacitor 12, with respect to the common node C in FIG. 3. The negative charging of MOSFET 24-27 gates starts again at t3 as shown in waveform 72 in FIG. 4. The discharging time of the gates of the MOSFET 24-MOSFET 27 to the 0V level is of approximately 100-200 nanoseconds $t_{fall}$ as shown in waveform section 82 in FIG. 4 and exploded in FIG. 5.

While the present invention has been related in terms of the foregoing embodiments, those skilled in the art will recognize that the invention is not limited to the embodiments depicted. The present invention can be practiced with modification and alteration within the spirit and scope of the appended claims. Thus, the description is to be regarded as illustrative instead of restrictive on the present invention.

What is claimed is:

1. A solid state relay circuit comprising:
a converter circuit coupled to a control input of the solid state relay circuit for converting the control input to a level shifted alternating voltage output;
a transformer coupled to the output of the converter circuit for providing isolation;
a rectifier coupled to an output of the transformer for conversion to a rectified and level shifted voltage output;
a capacitance circuit coupled to an output of the rectifier;
a power transistor having a control input, the power transistor is a plurality of power transistors having drain and sources coupled in parallel and having control inputs coupled in common to the charge and discharge transistors;
charge and discharge transistors coupled between the capacitance circuit and the control input of the power transistor; and
a control circuit having inputs coupled to an output of the rectifier and the capacitance circuit and having outputs coupled to control the charge and discharge transistors, the charge and discharge transistors are controlled by the control circuit such that capacitors in the capacitance circuit provide sufficient charge time to quickly turn on and discharge time to quickly turn off the power transistor by discharging or charging an equivalent capacitance at the control input of the power transistor.

2. A solid state relay circuit comprising:
a converter circuit coupled to a control input of the solid state relay circuit for converting the control input to a level shifted alternating voltage output;
a transformer coupled to the output of the converter circuit for providing isolation;
a rectifier coupled to an output of the transformer for conversion to a rectified and level shifted voltage output;
a capacitance circuit coupled to an output of the rectifier;
a power transistor having a control input, the power transistor is a plurality of power transistors having drain and source coupled in parallel and having control inputs coupled in common to the charge and discharge bipolar transistors, the capacitance of the capacitance circuit is significantly larger than the total equivalent capacitance seen at the control inputs of the plural power transistors, the plural power transistors are power MOSFET transistors;
charge and discharge transistors coupled between the capacitance circuit and the control input of the power transistor; and
a control circuit having inputs coupled to an output of the rectifier and the capacitance circuit and having outputs coupled to control the charge and discharge transistors, the charge and discharge transistors are controlled by the control circuit such that capacitors in the capacitance circuit provide sufficient charge time to quickly turn on and discharge time to quickly turn off the power transistor by discharging or charging an equivalent capacitance at the control input of the power transistor.

3. A solid state relay circuit comprising:
a converter circuit coupled to a control input of the solid state relay circuit for converting the control input to a level shifted alternating voltage output;
a transformer coupled to the output of the converter circuit for providing isolation;
a rectifier coupled to an output of the transformer for conversion to a rectified and level shifted voltage output;
a capacitance circuit coupled to an output of the rectifier;
a power transistor having a control input, the power transistor is a plurality of power transistors coupled in parallel having one end of its conduction path coupled to a center tap of the secondary of the transformer, having another end of its conduction path coupled to a load input and having control inputs coupled in common to the first and second transistors, the capacitance of the first and second capacitors is significantly larger than the total equivalent capacitance at the control inputs of the plural power transistors, the plural power transistors are power MOSFET transistors;
charge and discharge transistors coupled between the capacitance circuit and the control input of the power transistor; and
a control circuit having inputs coupled to an output of the rectifier and the capacitance circuit and having outputs coupled to control the charge and discharge transistors, the charge and discharge transistors are controlled by the control circuit such that capacitors in the capacitance circuit provide sufficient charge time to quickly turn on and discharge time to quickly turn off the power transistor by discharging or charging an equivalent capacitance at the control input of the power transistor.

4. A solid state relay circuit comprising:
a converter circuit coupled to a control input of the solid state relay circuit for converting the control input to a level shifted alternating voltage output;
a transformer coupled to the output of the converter circuit for providing isolation;
a rectifier coupled to an output of the transformer for conversion to a rectified and level shifted voltage output;
a capacitance circuit coupled to an output of the rectifier;
a power transistor having a control input, the power transistor is a first and second set of plural power transistors coupled in parallel having control inputs coupled in common to the first and second transistors, first and second sets having one end of the conduction path coupled in common to the center tap of the secondary of the transformer, first and second sets having the other end of each conduction path of the first set of power transistors coupled to a load input and having the other end of each conduction path of the second set of power transistors coupled to a load output, the capacitance of the first and second capacitors is significantly larger than the total equivalent capacitance at the control inputs of the first and second sets of the plural power transistors, the first and second sets of the plural power transistors are power MOSFET transistors;
charge and discharge transistors coupled between the capacitance circuit and the control input of the power transistor; and
a control circuit having inputs coupled to an output of the rectifier and the capacitance circuit and having outputs coupled to control the charge and discharge transistors, the charge and discharge transistors are controlled by the control circuit such that capacitors in the capacitance circuit provide sufficient charge time to quickly turn on and discharge time to quickly turn off the power transistor by discharging or charging an equivalent capacitance at the control input of the power transistor.

* * * * *